(12) United States Patent
Woo et al.

(10) Patent No.: US 10,720,352 B2
(45) Date of Patent: Jul. 21, 2020

(54) WAFER STORAGE CONTAINER

(71) Applicants: Pico & Tera Co., Ltd., Suwon-si (KR); Bum Je Woo, Seongnam-si (KR)

(72) Inventors: Bum Je Woo, Seongnam-si (KR); Seok Mun Yoon, Suwon-si (KR); Myoung Sok Han, Yongin-si (KR); Hyun Sin Kim, Cheonan-si (KR)

(73) Assignees: PICO & TERA CO., LTD., Suwon (KR); Bum Je Woo, Seongnam (KR)

( * ) Notice: Subject to any disclaimer, the term of this patent is extended or adjusted under 35 U.S.C. 154(b) by 349 days.

(21) Appl. No.: 15/079,632

(22) Filed: Mar. 24, 2016

(65) Prior Publication Data
US 2016/0284580 A1    Sep. 29, 2016

(30) Foreign Application Priority Data

Mar. 24, 2015    (KR) .................. 10-2015-0040523

(51) Int. Cl.
*H01L 21/677*    (2006.01)
*H01L 21/673*    (2006.01)

(52) U.S. Cl.
CPC .............................. *H01L 21/67393* (2013.01)

(58) Field of Classification Search
USPC .............. 206/710, 711; 118/500; 414/217.1
See application file for complete search history.

(56) References Cited

U.S. PATENT DOCUMENTS

| 7,658,289 B2* | 2/2010 | Sumi ................. F16K 15/026 137/508 |
| 2004/0099569 A1 | 5/2004 | Matsutori et al. |
| 2004/0182472 A1 | 9/2004 | Aggarwal |
| 2011/0284423 A1* | 11/2011 | Huang ................... G03F 1/64 206/710 |
| 2014/0223757 A1* | 8/2014 | Shibano ............ H01L 21/67359 34/82 |
| 2015/0214084 A1* | 7/2015 | Schneider ......... H01L 21/67161 206/711 |
| 2016/0118282 A1* | 4/2016 | Maraschin ........ H01L 21/67393 414/222.07 |

FOREIGN PATENT DOCUMENTS

| JP | 03-156951 A | 7/1991 |
| JP | 11251422 A | 9/1999 |
| JP | 200680458 A | 3/2006 |
| JP | 2006-351868 A | 12/2006 |
| JP | 2009141015 A | 6/2009 |
| JP | 2012-4199 A1 | 1/2012 |
| KR | 1020040074768 A | 8/2004 |
| KR | 10-2006-0100992 | 9/2006 |

(Continued)

*Primary Examiner* — Jacob K Ackun

(57) ABSTRACT

The present invention relates to a wafer storage container, more particularly, relates to a wafer storage container wherein the space of the wafer storage container is divided into the spaces, namely a storage room, a gas injection room, and a gas exhausting room, which are independent and separate from each other, so when the wafer storage container is transported to the load port and being coupled therewith, the purge gas is injected/exhausted through the separating walls inside the storage room, thereby efficiently removing the remaining fumes on the surface of the wafer.

2 Claims, 12 Drawing Sheets

(56) References Cited

FOREIGN PATENT DOCUMENTS

| | | |
|---|---|---|
| KR | 10-2010-0073568 | 7/2010 |
| KR | 10-2010-0134033 | 12/2010 |
| KR | 1020110041445 A | 4/2011 |
| KR | 10-2013-0120656 | 2/2014 |
| KR | 101387519 B1 | 4/2014 |
| TW | 200946418 A1 | 11/2009 |
| TW | 201425169 A | 7/2014 |

* cited by examiner

PRIOR ART

PRIOR ART

WAFER STORAGE CONTAINER

CROSS-REFERENCE TO RELATED APPLICATION

This application claims priority to and the benefit of Korean Patent Application No. 10-2015-0040523 filed on Mar. 24, 2015, the disclosure of which is incorporated herein by reference in its entirety.

FIELD OF INVENTION

The present invention relates to a wafer storage container, more particularly, relates to a wafer storage container for efficiently removing residual fumes remaining on the wafer surface by injecting purge gas.

BACKGROUND

Generally, semiconductor devices are manufactured by selectively and repeatedly performing processes such as vacuum deposition, polishing, photolithography, ion injection, cleaning, inspection, thermal treatment, and the like on the semiconductor wafers; and the wafers are transported to a specific location required for each process in order to be formed as semiconductor devices.

During the semiconductor manufacturing process, the wafers being processed are products of high precision, and they are stored in a wafer storage container such as a front opening unified pod (FOUP) for protection from contamination and damage due to foreign substances and external impact, and then transported for storage or processing.

In this case, process gases being used during the processing and fumes which are byproducts of the processes are not removed, but remain on the surfaces of the wafers and stored in the wafer storage container as they are.

However, proceeding of the processes with such residual materials adhered on the surfaces of the wafers will consequently followed by contamination of the semiconductor manufacturing equipments, failures in the etching pattern, and the like; thus, the reliability of the products will be degraded eventually. Therefore, various technologies for removing such residual materials are being developed.

A wafer storage container for removing fumes remaining on the wafer surface are described and disclosed in the patent literature Korean Patent Publication No. 2010-0134033.

As illustrated in FIGS. 1 and 2, the container portion 64 includes: a shell 65, a closed upper portion, a closed bottom surface, a closed left surface, a closed right surface, an open front surface, and a closed back surface 67.

A door 24 in the open front surface can seal the container portion 64.

A wafer shelf for storing a plurality of wafers may be included inside the container portion 64.

A kinematic coupling plate 74 is located in the bottom of the container and includes an appropriate opening for accommodating the front surface grommet and the back surface grommet 77 in the rearward port 54. The opening is being extended through the shell 65.

The container includes two rearward apertures 80 being extended from the inside of the container towards the outside thereof.

A tube type environment control element 78 configured as a tower element is inserted from the inside of the container portion 64 into the aperture 80.

The tube type element includes a containment portion 81, an offset portion 83, and a port portion 85.

The elastomer grommet 77 may be located in the lower region of the tube type element so as to be sealed hermetically, and a check valve 62 may be located therein.

A cylindrical type filter and/or a getter medial material 10 may be included in the containment portion, and configured to fit into the inside of the tube type element.

The tube type element includes a plurality of axially-extending apertures 11 comprising open horizontal slots.

In addition, the tube type element may include slits for each wafers and the purge gas is discharged at the slit position towards the surface of each wafer.

However, the wafer storage container of the prior art has a problem in that since gas injection area, wafer mounting area, and gas exhausting area cannot form independent space of their own, the gas flow is not uniform inside the wafer mounting area.

Besides, there is another problem in that: a dead zone, wherein the purge gas is not injected to the wafers being stored inside the wafer storage container, may occur; and the purge gas is injected intensively on a specific area since the purge gas is injected by the tube type element being installed vertically.

LEADING TECHNICAL LITERATURE

Patent Literature

Patent document 1: Korean Patent Publication No. 2010-0134033

SUMMARY OF THE INVENTION

An objective of the present invention devised for solving above described problems is to provide a wafer storage container wherein the space of the wafer storage container is divided into the spaces, namely a storage room, a gas injection room, and a gas exhausting room, which are independent and separate from each other, so that a purge gas is injected/exhausted through the separating walls inside the storage room, thereby efficiently removing the remaining fumes on the surface of the wafer.

A wafer storage container according to a special feature of the present invention is characterized in that and includes: a storage room wherein wafers are stored; a gas injection room wherein a gas inlet hole is formed in the bottom surface and communicating with the storage room along the side surface of the storage room; and a gas exhausting room wherein a gas exhausting hole is formed in the bottom surface and communicating with the storage room along the side surface of the storage room, wherein the storage room, the gas injection room, and the gas exhausting room are formed to be spaces independent and separate from each other.

In addition, it is characterized in that gas injection rooms are located in both sides of the storage room respectively, and the gas exhausting room is located in the back surface of the storage room.

In addition, it is characterized in that the gas injection room is located in one side of the storage room, and the gas exhausting room is located in the opposite side of the gas injection room.

In addition, it is characterized in that a first gas injection room is located in one side of the storage room, and a second gas injection room and the gas exhausting room are located in the opposite side of the storage room.

In addition, it is characterized in that the storage room and the gas injection room are formed to be spaces independent and separate from each other by separating walls, and holes are formed in the separating walls for communicating with gas.

In addition, it is characterized in that a plurality of holes is formed in the separating walls, and aperture areas of the holes are getting wider as they travel upward.

In addition, it is characterized in that a plurality of holes is formed in the separating walls, and a pipe having predetermined lengths is installed in the holes.

In addition, it is characterized in that one end of the pipe is installed in the hole of the separating walls, and the other end thereof is protruded towards the gas injection room.

In addition, it is characterized in that the length of the pipe is getting shorter as it travels towards the upper portion of the separating walls.

In addition, it is characterized in that a plurality of plates communicating with the gas injection room and injecting the gas into the storage room is installed in the sides of the storage room.

In addition, it is characterized in that a plurality of injection holes is formed in the plates.

In addition, it is characterized in that the plates are more protruded towards the wafer as they are getting closer to the surface of the storage room.

A wafer storage container according to another special feature of the present invention is characterized in that and includes: a storage room wherein wafers are stored; a gas injection room wherein a gas inlet hole is formed in the bottom surface and communicating with the storage room along the side surface of the storage room; a first separating wall separating the storage room and the gas injection room into spaces independent and separate from each other, and wherein a first hole communicating with gas is formed; a gas exhausting room wherein a gas exhausting hole is formed in the bottom surface and communicating with the storage room along the opposite side surface of the gas injection room; and a second separating wall separating the storage room and the gas exhausting room into spaces independent and separate from each other, and wherein a second hole communicating with gas is formed.

A wafer storage container according to yet another special feature of the present invention is characterized in that and includes: a storage room wherein wafers are stored; a pair of gas injection rooms wherein gas inlet holes are formed in the bottom surfaces thereof and communicating with the storage room along the both side surfaces of the storage room; a pair of first separating walls separating the storage room and the gas injection rooms into spaces independent and separate from each other, and wherein first holes communicating with gas are formed; a gas exhausting room wherein a gas exhausting hole is formed in the bottom surface and communicating with the storage room along the back surface of the storage room; and a second separating wall separating the storage room and the gas exhausting room into spaces independent and separate from each other, and wherein a second hole communicating with gas is formed.

A wafer storage container according to still another special feature of the present invention is characterized in that and includes: a storage room wherein wafers are stored; a first gas injection room wherein a gas inlet hole is formed in the bottom surface and communicating with the storage room along the side surface of the storage room; a first separating wall separating the storage room and the first gas injection room into spaces independent and separate from each other, and wherein a first hole communicating with gas is formed; a second gas injection room wherein a gas inlet hole is formed in the bottom surface and communicating with the storage room along the opposite side surface of the first gas injection room; a second separating wall separating the storage room and the second gas injection room into spaces independent and separate from each other, and wherein a second hole communicating with gas is formed; a gas exhausting room wherein a gas exhausting hole is formed in the bottom surface and communicating with the storage room along the opposite side surface of the first gas injection room; and a third separating wall separating the storage room and the gas exhausting room into spaces independent and separate from each other, and wherein a third hole communicating with gas is formed.

According to the wafer storage of the present invention as described above, there are advantageous effects as follows.

Fumes remaining on the wafer surface can be efficiently removed without any dead zone by injecting purge gas through the separating walls having holes located between the gas injection room and the storage room, unlike the wafer storage of the prior art wherein the purge gas is injected intensively towards a specific region.

The fumes on the wafer surfaces can be efficiently removed without any dead zone by respectively locating gas injection rooms in both sides of the storage room, removing the fumes on the wafers by injecting purge gas from both wall surfaces of the storage room, and exhausting the purge gas through the gas exhausting room located in the back surface of the storage room, thereby letting the purge gas injected from both side wall surfaces inside the wafer storage container be flowing towards the backside.

The fumes remaining on the wafer surfaces can be smoothly exhausted to the gas exhausting room by locating a gas injection room in one side of the storage room and the gas exhausting room in the opposite side of the gas injection room, thereby generating one directional flow of the purge gas.

The fumes on the wafer surfaces can be efficiently removed by locating a first gas injection room in one side of the storage room, and a second gas injection room and a gas exhausting room in the opposite side of the storage room, thereby increasing the amount of the purge gas injecting into the storage room.

The purge gas can be uniformly injected into the upper portion and the lower portion of the storage room by forming a plurality of holes in the separating walls, more enlarging the aperture area of the holes as they travel upward, and letting more amount of purge gas being entered via the gas inlet hole located in the bottom surface of the gas injection room be injected into the storage room as they travel upward, thereby preventing the purge gas from being injected only into the lower portion.

By forming a plurality of holes in the separating walls, installing pipes having a predetermined lengths in the holes, and letting the purge gas be injected from the gas injection room into the storage room via the pipes, the purge gas can be injected further into the storage room even when the purge gas is injected into the gas injection room via the gas inlet hole with a small pressure since the purge gas has the property that tends to travel in a straight line along the lengthwise direction of the pipes.

The purge gas can be uniformly injected into the upper portion and the lower portion of the storage room by forming the lengths of the pipes shorter as they travel towards the upper portion of the separating walls, and installing the pipes into the holes, thereby preventing the purge gas from injecting only into the lower portion of the storage room.

By installing plates in the side surfaces of the storage room for communicating with the gas injection room and injecting the gas into the storage room, and forming a plurality of injection holes in the plates, the fumes remaining on the wafer surfaces can be efficiently removed by injecting purge gas more closely to the wafer stored in the storage room.

The fumes on the wafer surfaces can be efficiently removed without any dead zone by letting each of the plates have a protruded portion which is more protruded towards the wafer as it travels towards the front surface of the storage room, and forming injection holes therein so that the purge gas can be injected at various angles.

DETAILED DESCRIPTION

Hereinafter, preferred exemplary embodiments of the present invention will be described with reference to the accompanying drawings as follows.

Figure 1:
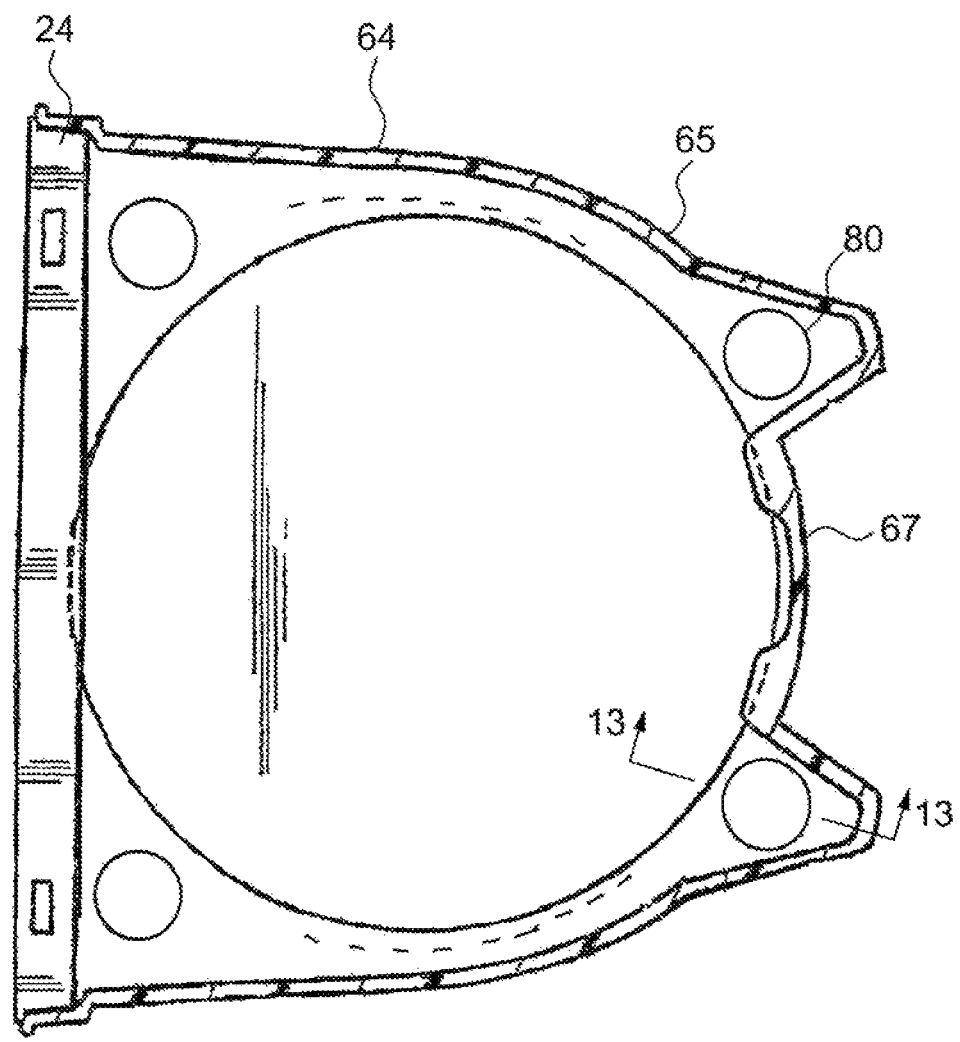
FIG. 1 is a plane view of a wafer storage container of the prior art.
Figure 2:
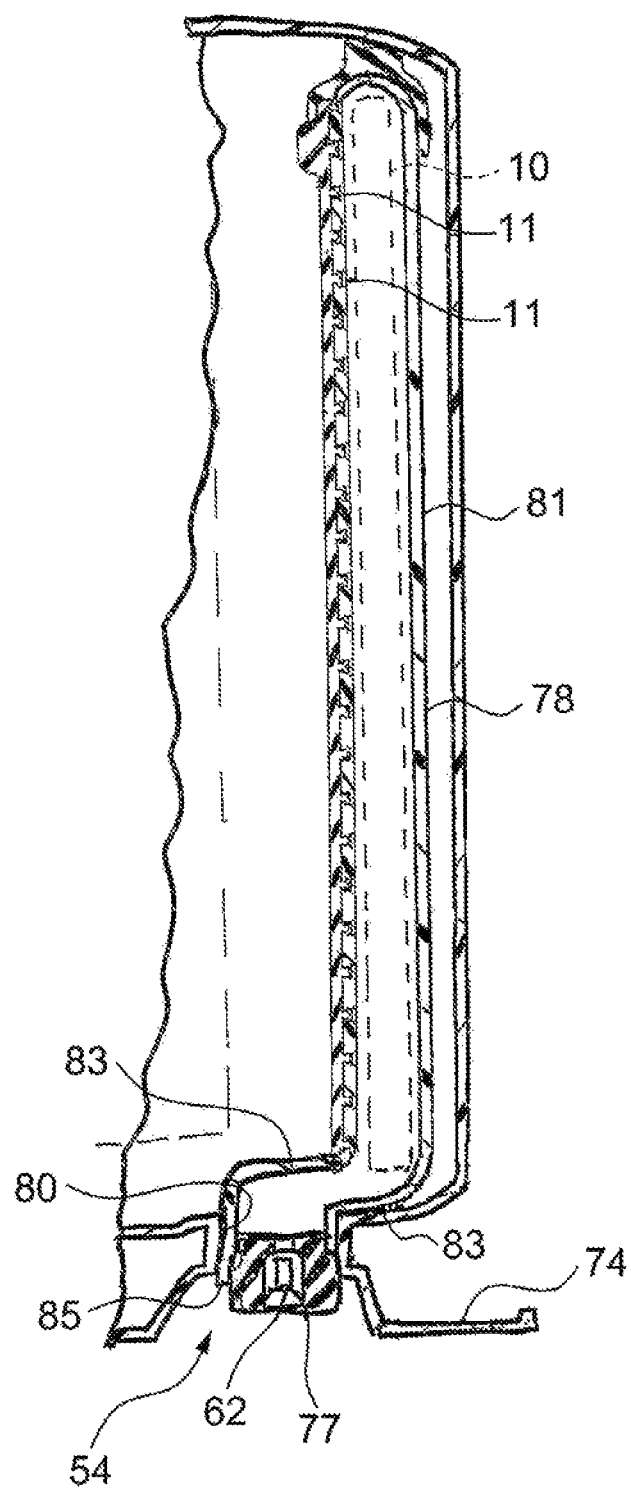
FIG. 2 is a cross-sectional view illustrating the line 13-13 in FIG. 1.
Figure 3:
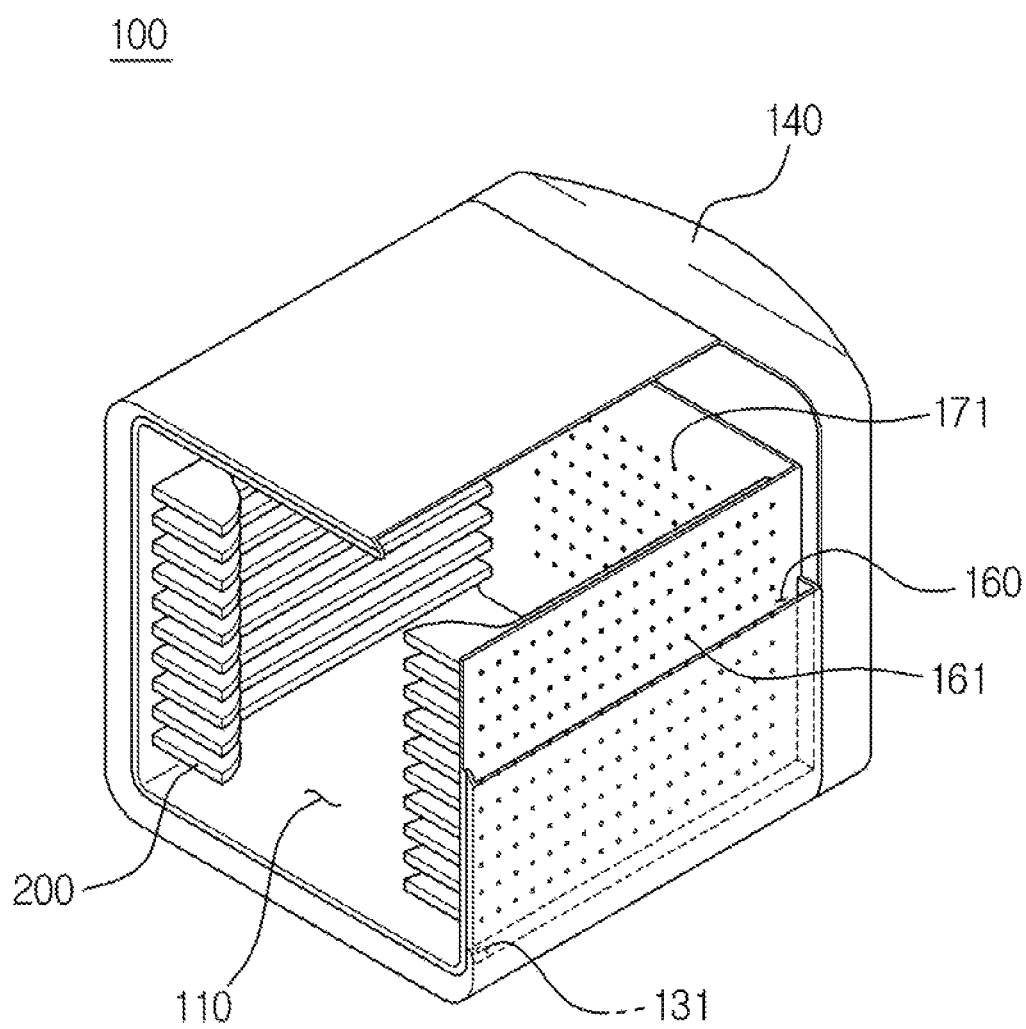
FIG. 3 is a perspective view of a wafer storage container according to the first exemplary embodiment of the present invention.
Figure 4:
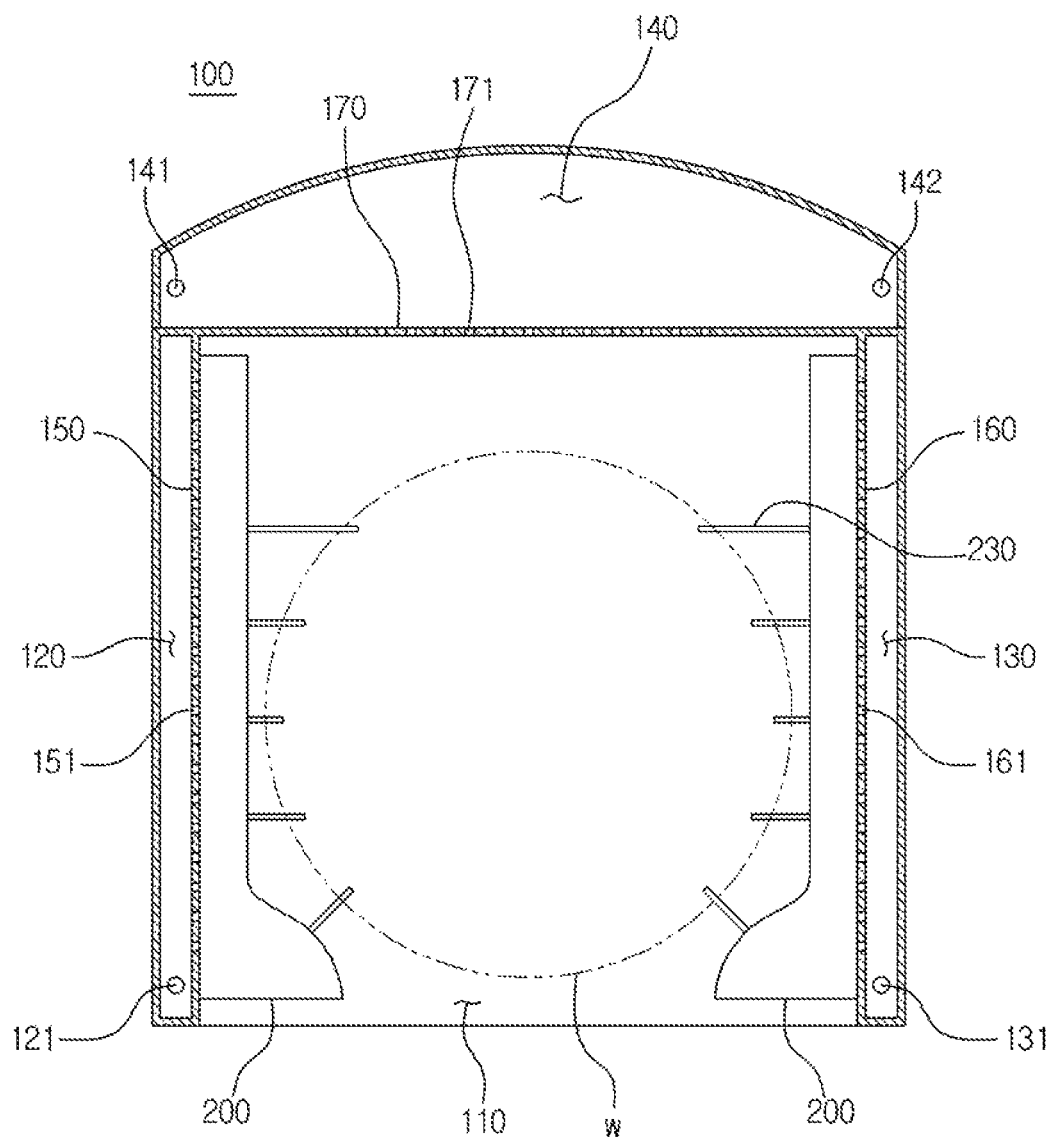
FIG. 4 is a plane view of FIG. 3.
Figure 5:
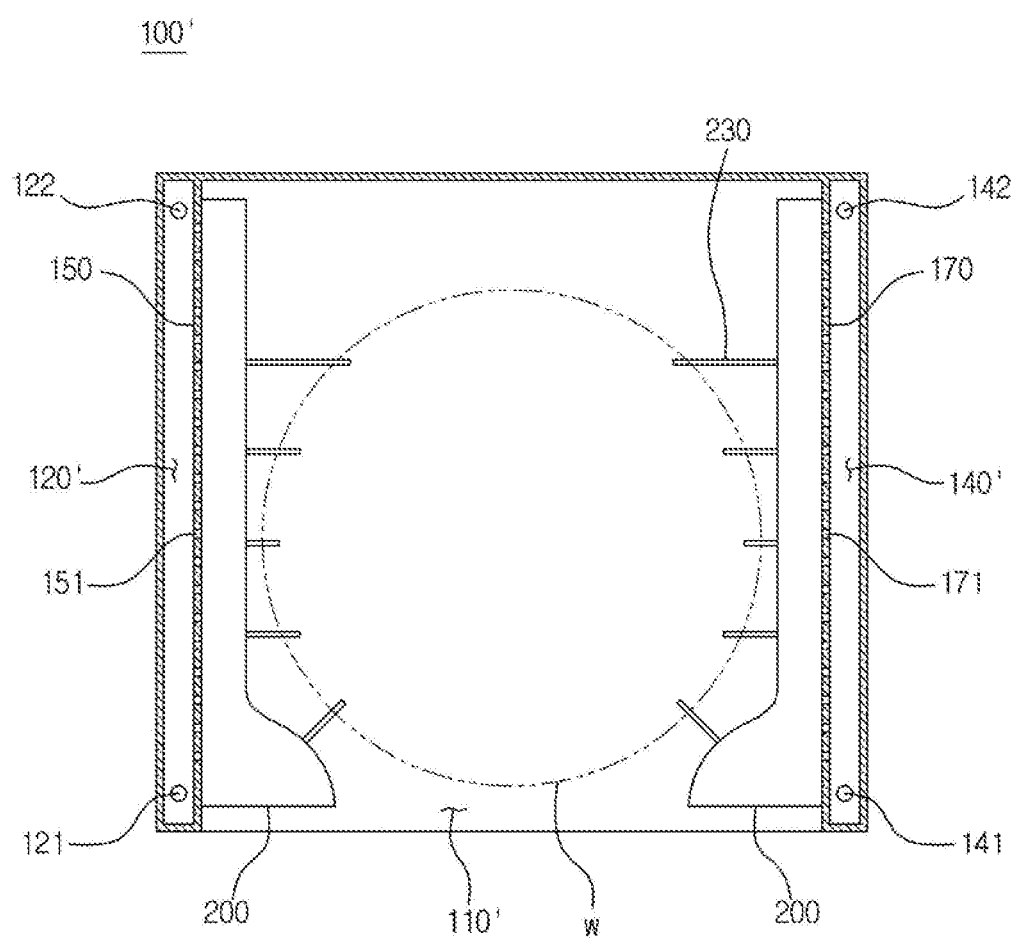
FIG. 5 is a plane view of a wafer storage container according to the second exemplary embodiment of the present invention.
Figure 6:
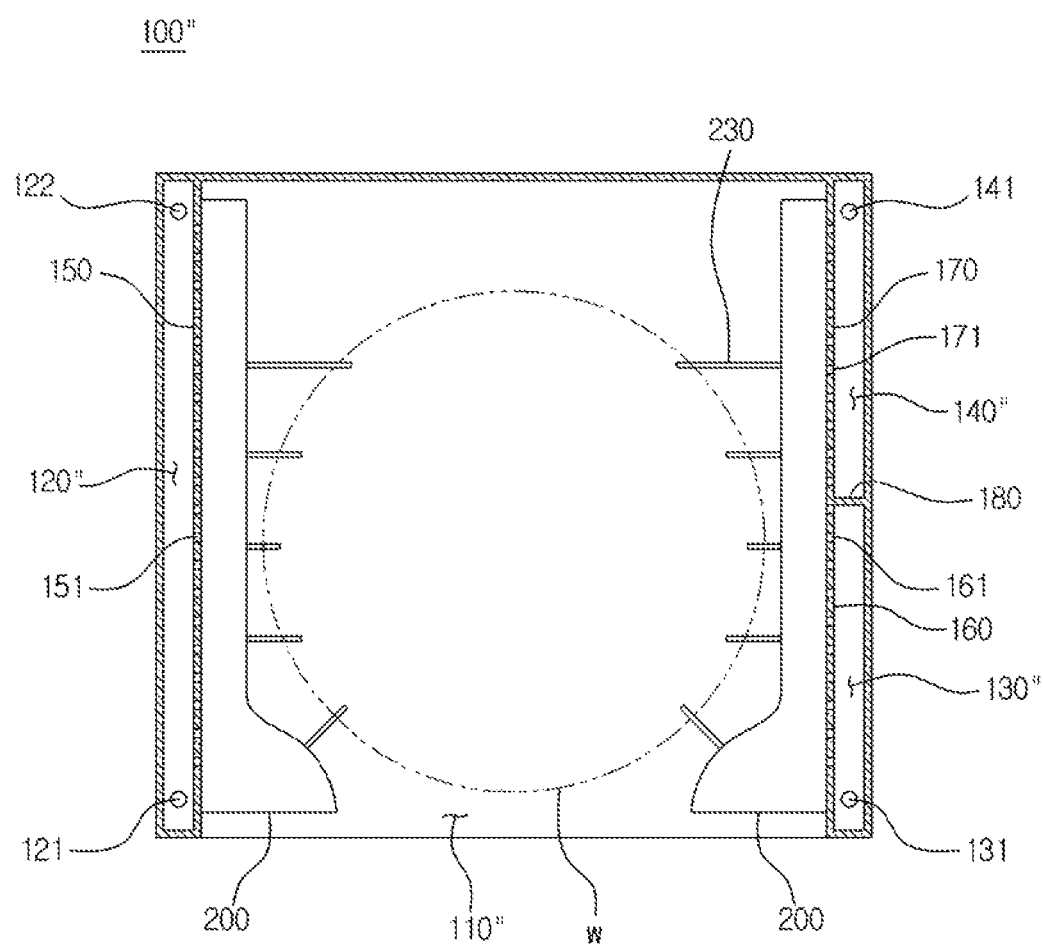
FIG. 6 is a plane view of a wafer storage container according to the third exemplary embodiment of the present invention.
Figure 7:
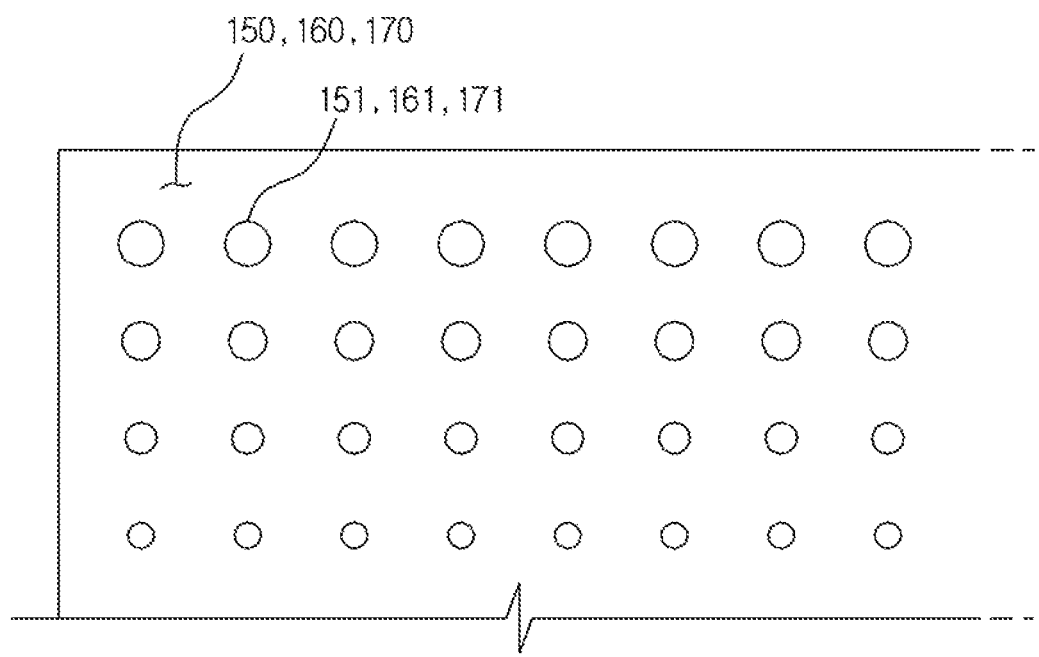
FIG. 7 is an exploded view illustrating the changes in the areas of the apertures of the holes in FIGS. 3 to 6.
Figure 8:
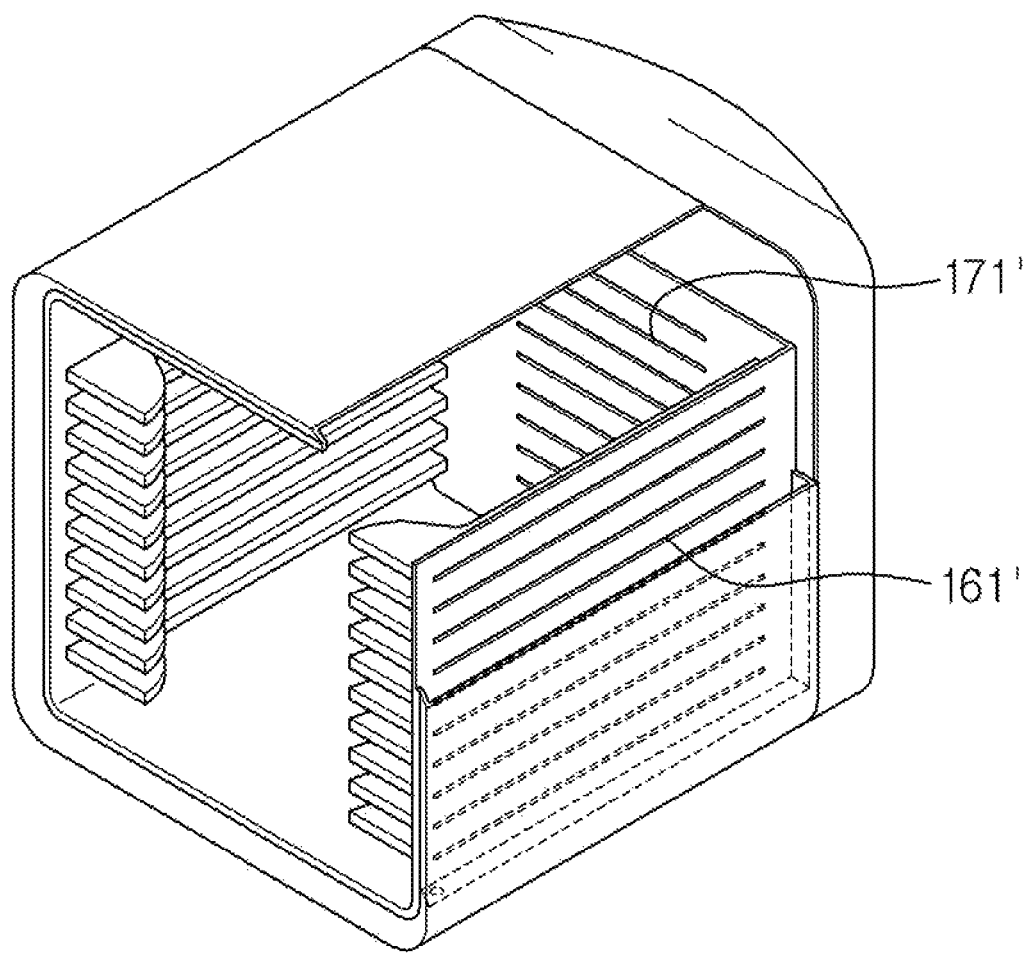
FIG. 8 is a perspective view illustrating another type of the holes in FIG. 3.
Figure 9:
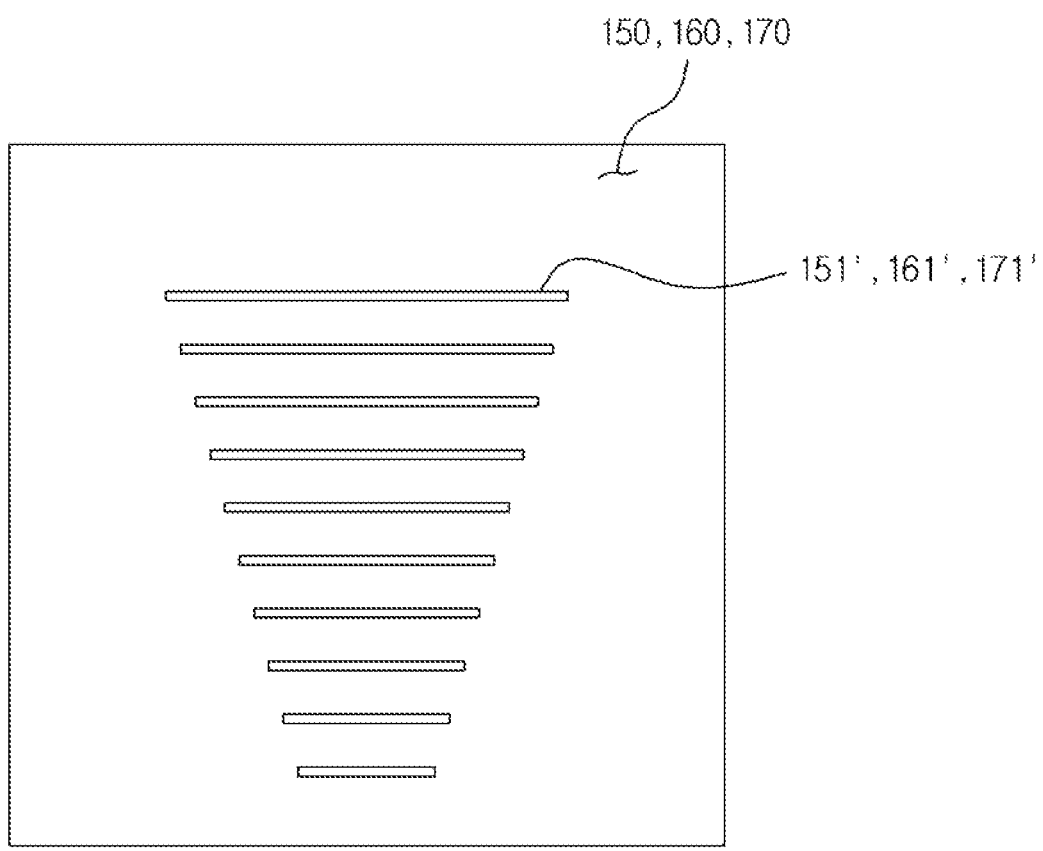
FIG. 9 is an exploded view illustrating the changes in the lengths of the holes in FIG. 8.
Figure 10:
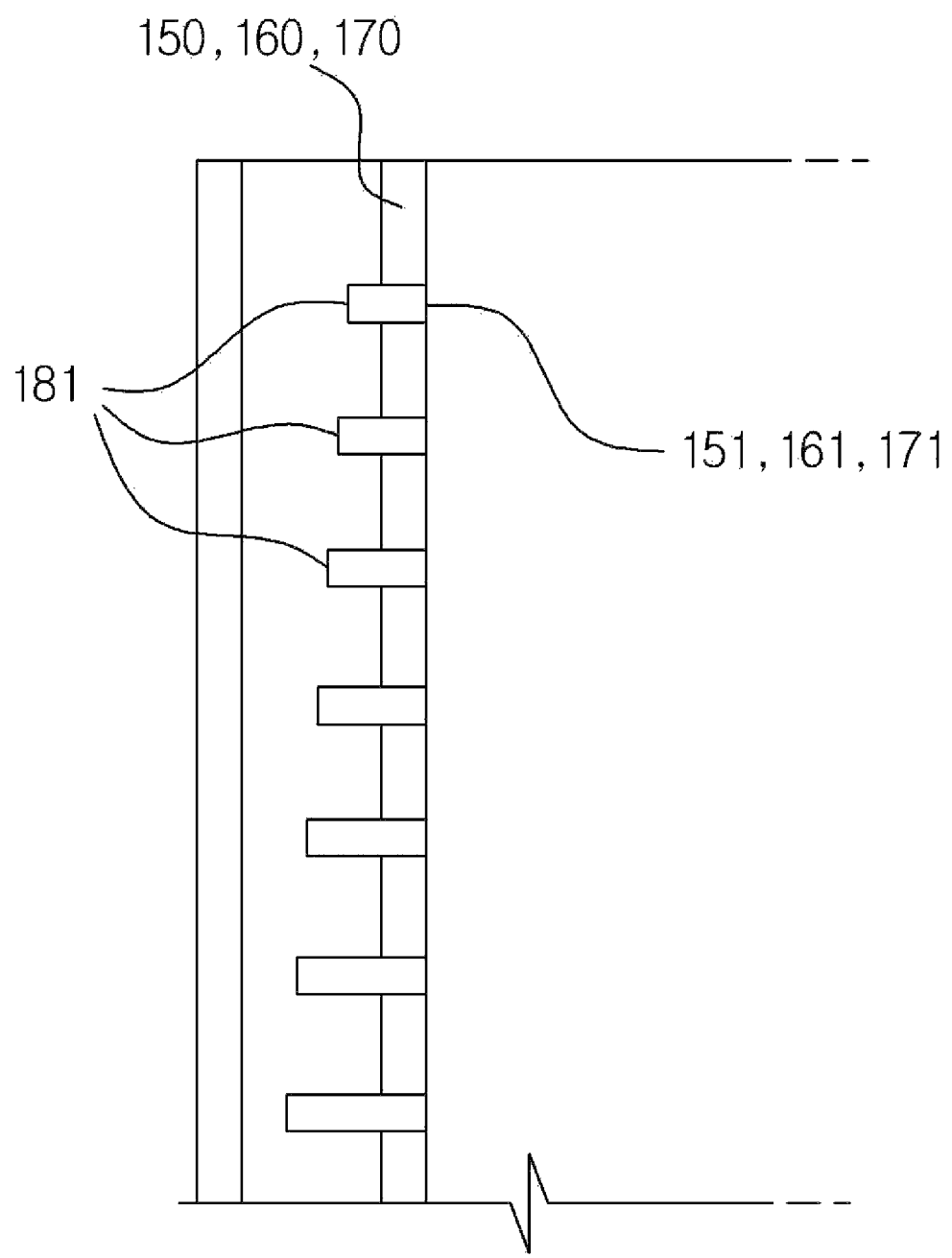
FIG. 10 is an exploded view illustrating the pipes installed in the holes of a separating wall.
Figure 11:
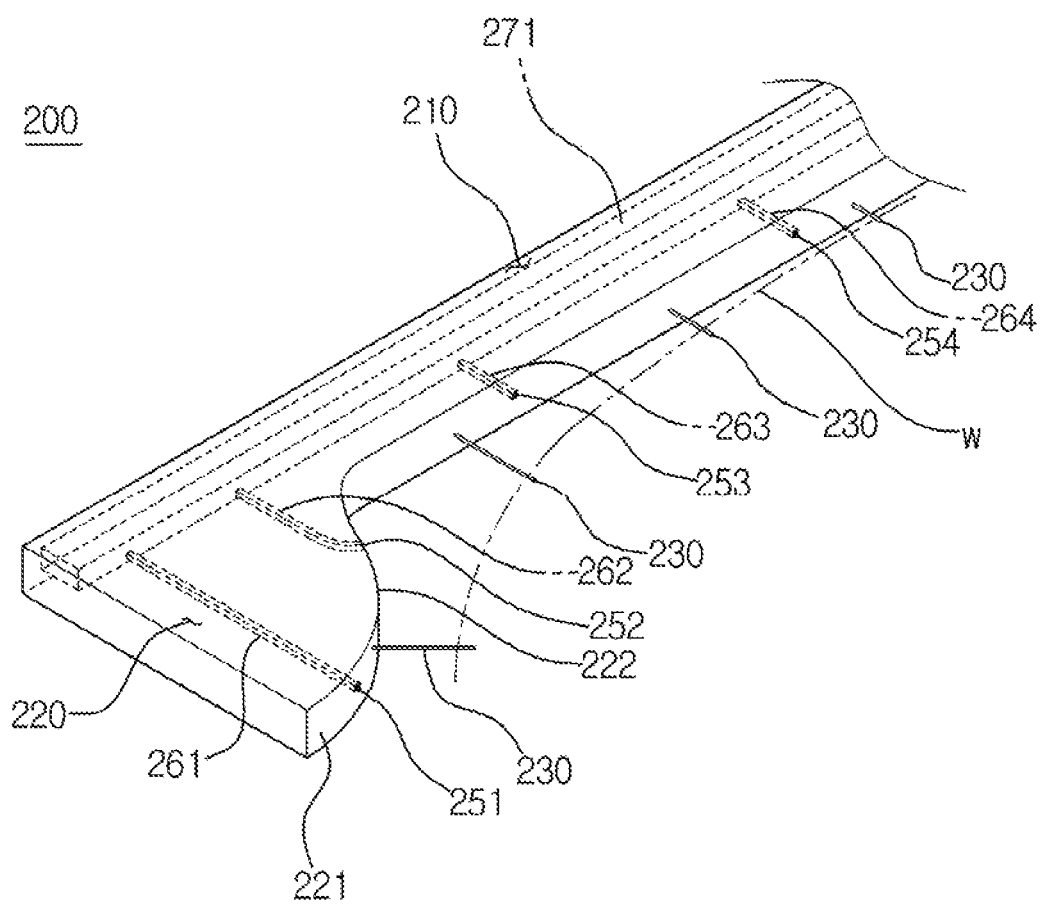
FIG. 11 is a perspective view illustrating the '1-1' exemplary embodiment of the plates in FIGS. 3 to 6.
Figure 12:
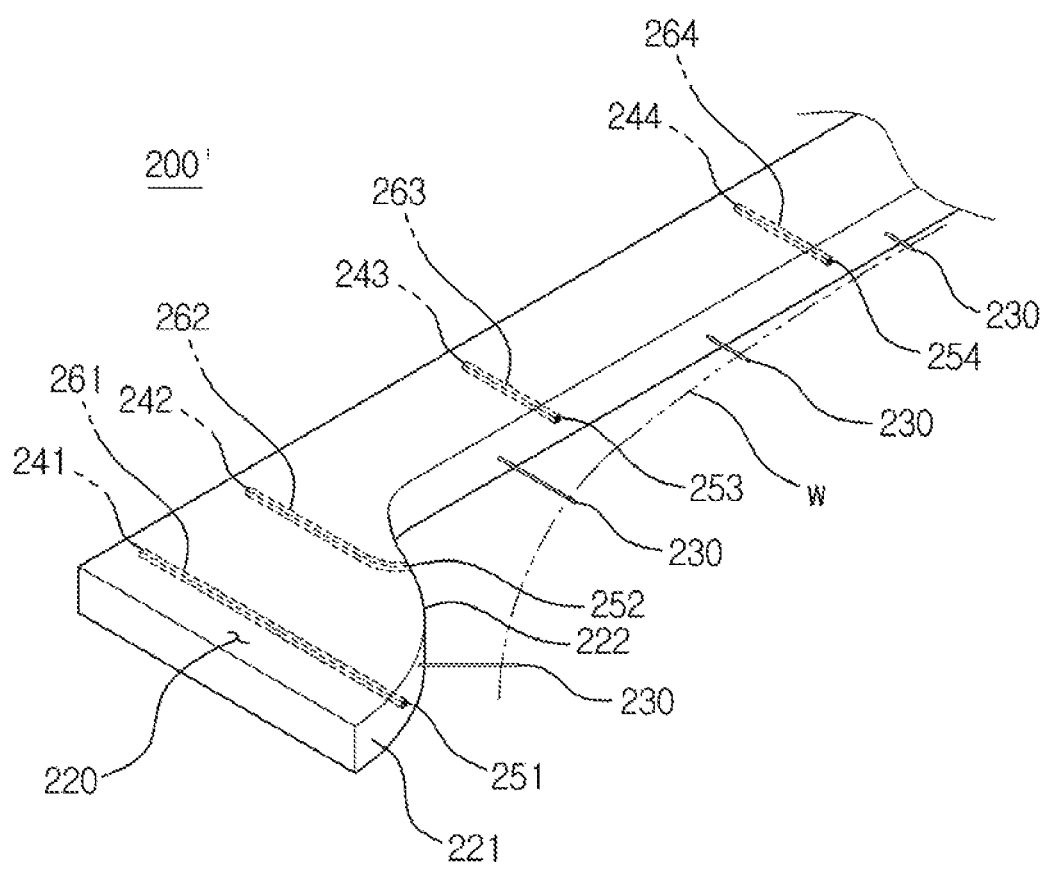
FIG. 12 is a perspective view illustrating the '1-2' exemplary embodiment of the plates in FIGS. 3 to 6.

FIG. 3 is a perspective view of a wafer storage container according to the first exemplary embodiment of the present invention; FIG. 4 is a plan view of FIG. 3; FIG. 5 is a plan view of a wafer storage container according to the second exemplary embodiment of the present invention; FIG. 6 is a plan view of a wafer storage container according to the third exemplary embodiment of the present invention; FIG. 7 is an exploded view illustrating the changes in the areas of the apertures of the holes in FIGS. 3 to 6; FIG. 8 is a perspective view illustrating another type of the holes in FIG. 3; FIG. 9 is an exploded view illustrating the changes in the lengths of the holes in FIG. 8; FIG. 10 is an exploded view illustrating the pipes installed in the holes of a separating wall; FIG. 11 is a perspective view illustrating the 1-1 exemplary embodiment of the plates in FIGS. 3 to 6; and FIG. 12 is a perspective view illustrating the 1-2 exemplary embodiment of the plates in FIGS. 3 to 6.

As illustrated in FIGS. 3 and 4, a wafer storage container 100 according to the first exemplary embodiment of the present invention includes: a storage room 110 wherein wafers w are stored; a first gas injection room 120 located at the left side of the storage room 110; a second gas injection room 130 located at the right side of the storage room 110; and a gas exhausting room 140 located at the back side surface of the storage room 110.

The upper portion and the lower portion of the storage room 110 are closed, and the front surface thereof can be opened, and a first separating wall 150 is formed in the left side surface, and a second separating wall 160 is formed in the right side surface, and a third separating wall 170 is formed in the back side surface.

That is, the first and the second gas injection rooms 120 and 130 are located at the left side and the right side of the storage room 110 respectively; the gas exhausting room 140 is located in the back side surface; the first, the second, and the third separating walls 150, 160, and 170 are formed between the first and the second gas injection rooms 120 and 130, the gas exhausting room 140, and the storage room 110 respectively, and thus the storage room 110, the first and the second gas injection rooms 120 and 130, and the gas exhausting room 140 form spaces independent and separate from each other.

Wafers w are being stored inside the storage room 110, and in this case, the wafers are supported by supporting members installed in both side surfaces inside the storage room 110, or, as illustrated in FIGS. 3 and 4, the wafers w can be supported by installing plates 200 multiply stacked in both side surfaces inside the storage room 110.

In addition, when the plates 200 are installed in the storage room 110, purge gas may be injected through the plates 200, and this will be described in detail later.

The first gas injection room 120 is located at the left side of the storage room 110, and the upper portion, the lower portion, the front and the back surfaces, and the left side surface are being closed, and the first separating wall 150 is formed in the right side surface thereof.

In addition, in the front bottom surface of the first gas injection room 120, a first gas inlet hole 121 introducing the purge gas being supplied from the supply portion of the load port when the wafer storage container 100 is coupled with the load port (not shown).

The second gas injection room 130 is located at the right side of the storage room 110, and the upper portion, the lower portion, the front and the back surfaces, and the right side surface are being closed, and the second separating wall 160 is formed in the left side surface thereof.

In addition, in the front bottom surface of the second gas injection room 130, a second gas inlet hole 131 introducing the purge gas being supplied from the supply portion of the load port when the wafer storage container 100 is coupled with the load port.

The gas exhausting room 140 is located at the back side of the storage room 110, and the upper portion, the lower portion, the back surface, and the left and the right side surfaces are being closed, and the third separating wall 170 is formed in the front surface thereof.

A plurality of first and second gas exhausting holes 141 and 142 are formed in the left and the right bottom surfaces inside the gas exhausting room 140 respectively for exhausting the fumes and the purge gas of the wafers w stored in the storage room 110 when the wafer storage container 100 is coupled to the load port.

In addition, of course, the locations and the numbers of the first and the second gas inlet holes 121 and 131, and the first and the second gas exhausting holes 141 and 142 can be changed depending on the types of the supply portion and exhausting portion of the load port where the wafer storage container 100 is being coupled to.

A plurality of first to third holes 151, 161, and 171 are formed in the first to third separating walls 150, 160, and 170.

The first and second holes 151 and 161 play the role of injecting purge gas from the first and second gas injection rooms 120 and 130 into the inside of the storage room 110.

The third hole 171 plays the role of exhausting the purge gas and the fumes, injected into the inside of the storage room 110 from the plates 200, to the gas exhausting room 140 which will be described later.

The first to third holes 151, 161, and 171 may be formed to have a plurality of holes therein respectively.

That is, the first and the second holes 151 and 161 may be formed to have a plurality of holes along the horizontal direction, and may be formed to have a plurality of holes along the vertical direction depending on the numbers of the wafers w being stored in the storage room 110.

In addition, the third hole 171 may be formed to have a plurality of holes along the horizontal and the vertical directions like the first and the second holes 151 and 161 depending on the amount of the purge gas and the fumes being injected into the inside of the storage room 110.

The first to third holes 151, 161, and 171 may be formed in a way that the areas of the apertures are getting larger as they travel upward in the first to third separating walls 150, 160, and 170, as illustrated in FIG. 7.

That is, the areas of the apertures of the first and the second holes 151 and 161 which are plurally formed along the vertical direction are getting larger as they travel towards the upper portion of the first and the second separating walls 150 and 160. Thus, when the purge gas is injected from the first and the second gas inlet holes 121 and 131 formed in the bottom surface of the first and the second gas injection rooms 120 and 130, which will be described later, and injected into the inside of the storage room 110 via the first and the second holes 151 and 161, the purge gas can be uniformly injected into the upper portion and the lower portion of the first and the second separating walls 150 and 160.

In addition, when the purge gas and the fumes existing in the storage room 110 are being exhausted to the first and the second exhausting holes 141 and 142 being formed in the bottom surface of the gas exhausting room 140, which will be described later, via the third holes 171, the purge gas and the fumes may be exhausted only to the bottom surface where the first and the second gas exhausting holes 141 and 142 are located, that is, the lower portion of the third separating wall 170. But, by forming the aperture areas of the third holes 171 plurally formed along the vertical direction in a way that they are getting larger as they travel towards the upper portion of the third separating wall 170, the exhaustion of the purge gas and the fumes only to the lower portion of the third separating wall 170 can be prevented.

The first to third holes 151, 161, and 171 may be configured to be the first holes (not shown in FIG. 8) and the second and the third holes 161' and 171' having the shape of a plurality of slits formed in length along the horizontal direction instead of a plurality of holes as illustrated in FIG. 8.

In addition, the first to third holes 151', 161', and 171' having the shape of a plurality of slits may also be formed in a way that the horizontal lengths thereof are getting longer as they travel towards the upper portion of the first to third separating walls 150, 160, and 170 respectively, as illustrated in FIG. 9. The effects are same as those of the first to third holes 151, 161, and 171 having the shape of a plurality of holes.

A plurality of pipes 181 may be formed in the first to third holes 151, 161, and 171.

The one ends of the pipes 181 are installed in the first to third holes 151, 161, and 171 which are respectively formed in the first to third separating walls 150, 160, and 170, and the other ends thereof are respectively protruded towards the first and the second gas injection rooms 120 and 130 and the gas exhausting room 140.

By installing the pipes 181 having a predetermined lengths in the first and the second holes 151 and 161, and letting the purge gas be injected from the first and the second gas injection rooms 120 and 130 into the storage room via the pipes 181, the purge gas can be injected further into the storage room 110 even when the purge gas is injected into the first and the second gas injection rooms 120 and 130 via the first and the second gas inlet holes 121 and 131, which will be described later, with a small pressure since the purge gas has the property that tends to travel in a straight line along the lengthwise direction of the pipes. And, by installing the pipes 181 having predetermined lengths in the third holes 171, the purge gas and the fumes may be more smoothly exhausted to the gas exhausting room 140 due to the same effects as previously described.

In addition, the lengths of the pipes 181 may be formed in a way that they are getting shorter as they travel towards the upper portion of the first to third separating walls 150, 160, and 170.

That is, by forming the lengths of the pipes 181 being plurally installed in the first to third holes 151, 161, and 171 along the vertical direction in a way that they are getting shorter as they travel upward, when the purge gas are being injected or the purge gas and the exhausting gas are exhausted via the pipes 181, large amount of purge gas flows in the upper portion where the lengths of the pipes 181 are relatively short, while relatively small amount of purge gas flows in the lower portion where the lengths of the pipes 181 are long, thus, the purge gas can be uniformly flowed in the upper portion and the lower portion of the first to third separating walls 150, 160, and 170.

Besides, the pipes 181 may be used in the first to third holes 151', 161', and 171' having the shape of a plurality of slits as previously described, and the effects thereof are same as the previously described ones.

As illustrated in FIGS. 3 to 8, the first to third holes respectively formed in the first to third separating walls 150, 160, and 170 of the wafer storage container 100 are comprised of only the first to third holes 151, 161, and 171 having the shape of a plurality of holes, or comprised of only the first to third holes 151', 161', and 171' having the shape of a plurality of slits, however, combination thereof may be used, for example, the first and the second separating walls 150 and 160 are formed to be the first and the second separating walls 150' and 160' having the shape of a plurality of slits, and the third separating wall 170 is formed to be the third hole 171 having the shape of a plurality of holes, etc.

Hereinafter, according to the previously described configurations, the process of removing fumes remaining on the surface of the wafers w stored in the wafer storage container 100 according to the first exemplary embodiment of the present example.

First, when the wafer storage container 100 is coupled to the load port (not shown), the purge gas being supplied from the supply portion of the load port is flowed into the first and the second gas injection rooms 120 and 130 via the first and the second gas inlet holes 121 and 131 respectively formed in the bottom surface inside of the first and the second gas injection rooms 120 and 130.

The purge gas flowed into the first and the second gas injection rooms 120 and 130 is flowed into the inside of the storage room 110 via the plurality of the first and the second holes 151 and 161 formed in the first and the second separating walls 150 and 160.

That is, the purge gas is injected from the left and the right side surfaces of the storage room 110, and the purges gas injected in such a way is exhausted, together with the fumes remaining on the surface of the wafers w, to the gas exhausting room 140 via the third hole 171 of the third separating wall 170.

The purge gas and the fumes exhausted to the gas exhausting room 140 is exhausted out to the exhausting portion of the load port via the first and the second exhausting holes 141 and 142 being formed in the left and the right bottom surface of the gas exhausting room 140.

In addition, when the wafer storage container 100 is separated from the load port and being transported for other processing, it is preferred that the wafer storage container 100 is sealed by coupling the door (not shown) with the open front portion of wafer storage container 100 in order to prevent contamination of the wafers w stored in wafer storage container 100.

Of course, the fumes remaining on the surfaces of the wafers w can be removed under the sealed state achieved by coupling the door with the open front portion of wafer storage container 100 during the process of removing the fumes remaining on the surfaces of the wafers W.

Hereinafter, the aforementioned plate will be described.

As previously described, when plates 200 are installed in both side surfaces inside of the storage room 110, the plates 200 can also play the role of supporting the wafers w; and by forming flow paths inside the plates 200, the purge gas injected from the first and the second gas injection rooms 120 and 130 may also be injected through the flow paths inside the plates 200.

So, the plates wherein flow paths are formed for injecting purge gas will be described with reference to the 1-1 and the 1-2 exemplary embodiments as examples.

A plate 200 according to the 1-1 exemplary embodiment of the present invention, as illustrated in FIG. 11, includes a body portion 210 and a protruded portion 220 protruded further towards the direction facing the wafers as it travels towards the front surface of the plate 200.

That is, the plate 200 may be configured in a way that the body portion 210 and the protruded portion 220 are forming the shape of the letter 'L'.

The protruded portion 220 is formed in the front surface in one side of the body portion 210, and a third and a fourth injection holes 253 and 254, which will be described later, are formed in the remaining surface in one side of the body portion 210 excluding the protruded portion 220.

In addition, a communicating chamber 271 is formed inside the body portion 210, and one end of the communicating chamber 271 forms a slot having the shape of a slit formed in length along the length direction in the other side surface of the body portion 210, and the other end of the communicating chamber 271 is communicating with the first to fourth flow paths 261, 262, 263, and 264, which will be described later.

The protruded portion 220 comprises a first protruded surface 221 and a second protruded surface 222 forming the shape of a convex arc.

In addition, a first injection hole 251, which will be described later, is formed in the first protruded surface 221, and a second injection hole 252, which will be described later, is formed in the second protruded surface 222.

A plurality of supporting rods 230 may be installed in one side of the protruded portion 220 and the body portion 210 of the plate 200, and the wafers w are seated on the supporting rods 230.

The supporting rods 230 can prevent damages to the wafers w by minimizing the contact area contacting the wafers w.

In addition, the wafers w can be seated on a portion of the upper surface of the plate 200 and supported thereby, and in this case, there is an advantage in that the wafers w can be supported without installing a separate member such as a supporting rod 230.

The communicating chamber 271 is communicating with the first and the second holes 151 and 161 of the first and the second separating walls 150 and 160, and plays the role of introducing the purge gas injected from the first and the second gas injection rooms 120 and 130.

The one ends of the first to fourth flow paths 261, 262, 263, and 264 are communicating with the communicating chamber 271, and the other ends thereof are communicating with the first to fourth injection holes 251, 252, 253, and 254 respectively.

The first and the second injection holes 251 and 252 are formed in the first and the second protruded surfaces 221 and 222 of the protruded portion 220 respectively, and the third and the fourth injection holes 253 and 254 are formed in one side surface of the body portion 210, so that the purge gas can be injected in various direction, therefore, the dead zone where the fumes remaining on the surfaces of the wafers w can be minimized.

In this case, the second flow path 262 may be bended in order to easily communicate between the second injection hole 252 formed in the second protruded surface 222 and the second flow path 262.

The purge gas is injected via the first to fourth injection holes 241, 242, 243, and 244 of the plate, and passes through the communicating chamber 271 and the first to fourth flow paths 261, 262, 263, and 264, and then injected into the inside of the storage room 110 via the first to fourth injection holes 251, 252, 253, and 254.

In this case, the purge gas injected into the communicating chamber 271 flows through the first to fourth flow paths 261, 262, 263, and 264 separately, therefore, the purge gas can be injected into the storage room 110 via the first to fourth injection holes 251, 252, 253, and 254 with a uniform pressure.

In addition, unlike the previously described plate 200 according to the '1-1' exemplary embodiment, the plate may be formed with a plate 200' according to the second exemplary embodiment without a communicating chamber 271 therein.

A plate 200' according to the '1-2' exemplary embodiment of the present invention includes a body portion 210 and a protruded portion 220 which is more protruded towards the wafer w as it is getting closer to the front surface of the plate 200' as illustrated in FIG. 12.

That is, the plate 200' may be configured in a way that the body portion 210 and the protruded portion 220 are forming the shape of the letter 'L'.

The protruded portion 220 is formed in the front surface in one side of the body portion 210, and a third and a fourth injection holes 253 and 254 are formed in the remaining surface in one side of the body portion 210 excluding the protruded portion 220, and a first to fourth inlet holes 241, 242, 243, and 244 are formed in the other side of the body portion 210.

The protruded portion 220 comprises a first protruded surface 221 and a second protruded surface 222 forming the shape of a convex arc.

In addition, a first injection hole 251 is formed in the first protruded surface 221, and a second injection hole 252 is formed in the second protruded surface 222.

A plurality of supporting rods 230 may be installed in one side of the protruded portion 220 and the body portion 210 of the plate 200', and the wafers w are seated on the supporting rods 230.

The supporting rods 230 can prevent damages to the wafers w by minimizing the contact area contacting the wafers w.

In addition, the wafers w can be seated on a portion of the upper surface of the plate 200' and supported thereby, and in this case, there is an advantage in that the wafers w can be supported without installing a separate member such as a supporting rod 230.

The one ends of the first to fourth inlet holes 241, 242, 243, and 244 are communicating with the plurality of the first and the second holes 151 and 161 of the first and the second separating walls 150 and 160, and the other ends thereof are directly communicating with the first to fourth injection holes 251, 252, 253, and 254 through the first to fourth flow paths 261, 262, 263, and 264 respectively.

The first and the second injection holes 251 and 252 are formed in the first and the second protruded surfaces 221 and 222 of the protruded portion 220 respectively, and the third and the fourth injection holes 253 and 254 are formed in one side surface of the body portion 210, so that the purge gas can be injected in various direction, therefore, the dead zone where the fumes remaining on the surfaces of the wafers w can be minimized.

In this case, the second flow path 262 may be bended in order to easily communicate between the second injection hole 252 formed in the second protruded surface 222 and the second flow path 262.

Unlike the plate 200 according to the '1-1' exemplary embodiment, since there is no communicating chamber 271 in the plate 200' according to the '1-2' exemplary embodiment, the purge gas injected into the first to fourth injection holes 241, 242, 243, and 244 is directly injected through the first to fourth injection holes 251, 252, 253, and 254, thus, the purge gas can be injected further than the plate 200 according to the '1-1' exemplary embodiment.

Although the plates 200 and 200' having four injection holes such as the first to fourth injection holes 251, 252, 253, and 254 are exemplary described above, the numbers of the injection holes thereof may vary depending on the shapes and the numbers of holes to be formed in the first and the second separating walls 150 and 160.

In addition, as previously described, they (the holes) may be formed as the first and the second holes 151 and 161 having the shape of a plurality of holes, or the first and the second holes 151' and 161' having the shape of a plurality of slits in the first and the second separating walls 150 and 160. However, it is certain that above mentioned holes can communicate with the communicating chamber 271 of the plate 200 of the first exemplary embodiment and the first to fourth inlet holes 241, 242, 243, and 244 of the plate 200' of the second exemplary embodiment.

As illustrated in FIG. 5, a wafer storage container 100' according to the second exemplary embodiment of the present invention is characterized in that a first gas injection room 120' may be located at the left side of a storage room 110', and a gas exhausting room 140' may be located at the right side of the storage room 110'.

That is, a first separating wall 150 is formed in the left side surface of the storage room 110', and a third separating wall 170 is formed in the right side surface. Thus, the storage room 110', the first gas injection room 120', and the gas exhausting room 140' are forming spaces independent and separate from each other.

A first gas inlet hole 121 and a third gas inlet hole 122 are formed respectively in the front side and the back side of the bottom surface inside the first gas injection room 120', and a first gas exhausting hole 141 and a second gas exhausting hole 142 are formed respectively in the front side and the back side of the bottom surface inside the gas exhausting room 140'.

A first and a third holes 151 and 171 are formed in the first and the third separating walls 150 and 170 respectively.

The first and the third holes 151 and 171 may be formed to have the shape of a plurality of holes or a plurality of slits as previously described, the description thereabout will be omitted.

According to the above described configuration, a wafer storage container 100' according to the second exemplary embodiment of the present invention is characterized in that purge gas is injected into the storage room 110' from the first gas injection room 120' located at the left side of the storage room 110', and the injected purge gas and the fumes remaining on the surface of the wafers w are exhausted out to the exhausting portion of the load port (not shown) located at the right side of the storage room 110' through the gas exhausting room 140'.

Of course, the first gas injection room 120' of the wafer storage container 100' according to the second exemplary embodiment of the present invention may be located at the right side of the storage room 110', and a second injection room 130' may be located at the left side of the storage room 110'.

In addition, in the storage room 110' of the wafer storage container 100' according to the second exemplary embodiment of the present invention, the plates 200 and 200' according to the previously described '1-1' and '1-2' exemplary embodiments may be plurally stacked, and the resulting effects are same as those of the wafer storage container 100 according to the first exemplary embodiment.

As illustrated in FIG. 6, a wafer storage container 100" according to the third exemplary embodiment of the present invention is characterized in that a first gas injection room 120" may be located at the left side of a storage room 110", and a second gas injection room 130" and a gas exhausting room 140" may be located at the right side of the storage room 110".

That is, a first separating wall 150 is formed in the left side surface of the storage room 110", and a second separating wall 160 is formed in the right front surface, and a third separating wall 170 is formed in the right back side surface. Thus, the storage room 110', the first and the second gas injection rooms 120" and 130", and the gas exhausting room 140" are forming spaces independent and separate from each other.

A first gas inlet hole 121 and a third gas inlet hole 122 are formed respectively in the front side and the back side of the bottom surface inside the first gas injection room 120", and a second gas inlet hole 131 is formed in the front side of the bottom surface inside the second gas injection room 130", and a first gas exhausting hole 141 is formed in back side of the bottom surface inside the gas exhausting room 140".

In addition, a fourth separating wall 180 is formed between the second gas injection room 130" and the gas exhausting room 140", thus plays the role of forming the second gas injection room 130" and the gas exhausting room 140" into spaces independent and separate from each other.

A first to third holes 151, 161, and 171 are formed in the first to third separating walls 150, 160 and 170 respectively.

The first to third holes 151, 161, and 171 may be formed to have the shape of a plurality of holes or a plurality of slits as previously described, the description thereabout will be omitted.

According to the above described configuration, a wafer storage container 100" according to the third exemplary embodiment of the present invention is characterized in that purge gas is injected into the storage room 110" from the first gas injection room 120" located at the left side of the storage room 110" and the second gas injection room 130" located at the right front side, and the injected purge gas and the fumes of the wafers w are exhausted out to the exhausting portion of the load port (not shown) located at the right back side of the storage room 110' through the gas exhausting room 140".

Of course, the first gas injection room 120" of the wafer storage container 100" according to the third exemplary embodiment of the present invention may be located at the right side of the storage room 110", and a second injection room 130" and the second gas injection room 130" may be located at the back side of the storage room 110", and the gas exhausting room 140" may be located in the front side of the storage room 110".

In addition, in the storage room 110" of the wafer storage container 100" according to the second exemplary embodiment of the present invention, the plates 200 and 200' according to the previously described '1-1' and '1-2' exemplary embodiments may be plurally stacked, and the resulting effects are same as those of the wafer storage container 100 according to the first exemplary embodiment.

Although the present invention herein has been described with reference to the preferred embodiments as described above, it will be apparent to those skilled in the art that various changes and modification may be made to the above described embodiments, without departing from the scope and spirit of the present invention as disclosed in the accompanying claims.

REFERENCE NUMERALS

100, 100', 100": wafer storage container
110, 110', 110": storage room
120, 120', 120": first gas injection room
121: first gas inlet hole
122: third gas inlet hole
130, 130', 130": second gas injection room
131: second gas inlet hole
140, 140', 140": gas exhausting room
141: first gas exhausting hole
142: second gas exhausting hole
150: first separating wall
151, 151': first hole
160: second separating wall
161, 161': second hole
170: third separating wall
171, 171': third hole
180: fourth separating wall
181: pipe
200, 200': plate
210: body portion
220: protruded portion
221: first protruded surface
222: second protruded surface
230: supporting rod
241: first inlet hole
242: second inlet hole
243: third inlet hole
244: fourth inlet hole
251: first injection hole
252: second injection hole
263: third injection hole
264: fourth injection hole
261: first flow path
262: second flow path
263: third flow path
264: fourth flow path
271: communicating chamber

What is claimed is:

1. A wafer storage container comprising:

a storage room stacking wafers in a vertical direction, wherein a first separating wall formed in a left side surface of the storage room, a second separating wall formed in a right side surface of the storage room, and a third separating wall formed in a back side surface of the storage room;

a first plurality of holes formed in the first separating wall in a first horizontal direction and the vertical direction for injecting a gas to the storage room;

a second plurality of holes formed in the second separating wall in the first horizontal direction and the vertical direction for injecting the gas to the storage room;

a third plurality of holes formed in the third separating wall in a second horizontal direction and the vertical direction for exhausting the gas from the storage room;

a first gas injection room disposed at a left side of the storage room, communicating with the storage room through the first plurality of holes, and having a first gas inlet hole supplying the gas to the first gas injection room, wherein the first separating wall is formed in a right side surface of the first gas injection room;

a second gas injection room disposed at a right side of the storage room, communicating with the storage room through the second plurality of holes, and having a second gas inlet hole supplying the gas to the second gas injection room, wherein the second separating wall is formed in a left side surface of the second gas injection room;

a gas exhausting room disposed at a back side of the storage room, communicating with the storage room through the third plurality of holes, and having one or more gas exhausting holes exhausting the gas from the gas exhausting room, wherein the third separating wall is formed in a front side surface of the gas exhausting room; and a plurality of plates installed in the storage room to be vertically spaced, so as to support said wafers, respectively, wherein the gas injected into the storage room through the first plurality of holes and the second plurality of holes is exhausted from the storage room through the third plurality of holes, wherein each of the plurality of plates comprises:
a body portion;
a plurality of injection holes formed in one side surface of the body portion; and
a communicating chamber formed inside the body portion, wherein one end of the communicating chamber has a slot formed at the other side surface of the body portion along a length direction of the body portion for communicating with a horizontal plurality of holes among the first plurality of holes or the second plurality of holes, wherein the other end of the communicating chamber is communicating with a plurality of flow paths, the plurality of flow paths communicating with the plurality of injection holes, respectively, and wherein the purge gas is injected via the horizontal plurality of holes, passes through the communicating chamber and the plurality of flow paths, and then injected into an inside of the storage room via the plurality of injection holes.

2. The wafer storage container of claim 1, wherein areas of the first plurality of holes increase in the vertical direction toward an upper portion of the first separating wall, and areas of the second plurality of holes increase in the vertical direction toward an upper portion of the second separating wall.

* * * * *